(12) United States Patent
Yamazoe et al.

(10) Patent No.: US 9,678,441 B2
(45) Date of Patent: Jun. 13, 2017

(54) MASK PATTERN GENERATION METHOD AND OPTICAL IMAGE CALCULATION METHOD

(71) Applicant: CANON KABUSHIKI KAISHA, Tokyo (JP)

(72) Inventors: Kenji Yamazoe, Brookline, MA (US); Ryo Nakayama, Utsunomiya (JP); Hiroyuki Ishii, Shioya-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 120 days.

(21) Appl. No.: 14/537,639

(22) Filed: Nov. 10, 2014

(65) Prior Publication Data

US 2015/0131066 A1 May 14, 2015

(30) Foreign Application Priority Data

Nov. 12, 2013 (JP) ................. 2013-234253

(51) Int. Cl.
*G03B 27/42* (2006.01)
*G03F 7/20* (2006.01)
*G03F 1/70* (2012.01)

(52) U.S. Cl.
CPC ............ *G03F 7/70616* (2013.01); *G03F 1/70* (2013.01)

(58) Field of Classification Search
CPC .... G03F 1/70; G03F 7/70058; G03F 7/70616; G06K 9/3241; G06T 19/006; G06T 2207/10016; G06T 2207/20201; G06T 7/0044; G06T 7/0071; G06T 7/20

See application file for complete search history.

(56) References Cited

U.S. PATENT DOCUMENTS

| | | | |
|---|---|---|---|
| 5,707,765 A * | 1/1998 | Chen ................. | G03F 7/70433 430/296 |
| 6,519,760 B2 * | 2/2003 | Shi ..................... | G03F 7/70125 716/53 |
| 7,594,199 B2 * | 9/2009 | Socha .................. | G03F 1/36 716/53 |
| 8,234,600 B2 * | 7/2012 | Kawashima ............ | G03F 1/36 430/30 |

(Continued)

FOREIGN PATENT DOCUMENTS

| | | |
|---|---|---|
| JP | 2004-221594 A | 8/2004 |
| JP | 2008-40470 A | 2/2008 |

*Primary Examiner* — Deoram Persaud
(74) *Attorney, Agent, or Firm* — Canon USA, Inc. IP Division

(57) ABSTRACT

In a method for generating, with a computer, a pattern of a mask, a pattern on an object plane of a projection optical system is set, shifted plural pupil functions are generated, a matrix containing the generated plural pupil functions is defined, an image of the pattern on the object plane is calculated by generating a vector obtained by transposing and complex-conjugating a vector containing, as components, values of the pupil functions at origin coordinates on a pupil plane from among components of the matrix, and performing convolution integral between the pattern on the object plane and a Fourier transform of a product of the vector and the matrix, an assist pattern for the pattern on the object plane is generated using the calculated image, and a pattern of the mask including the pattern on the object plane and the assist pattern is generated.

16 Claims, 5 Drawing Sheets

(56) References Cited

U.S. PATENT DOCUMENTS

| | | | | |
|---|---|---|---|---|
| 8,278,762 | B2* | 10/2012 | Lin | G03F 1/36 257/734 |
| 8,423,922 | B2* | 4/2013 | Kai | G03F 1/36 716/50 |
| 2002/0062206 | A1* | 5/2002 | Liebchen | G03F 7/705 703/6 |
| 2006/0009957 | A1* | 1/2006 | Kohle | G03F 1/36 703/2 |
| 2007/0230819 | A1* | 10/2007 | Shimizu | G06T 7/0002 382/275 |
| 2008/0145769 | A1* | 6/2008 | Kawakami | G03F 1/36 430/5 |
| 2009/0027650 | A1* | 1/2009 | Yamazoe | G03F 1/36 355/77 |
| 2014/0244215 | A1* | 8/2014 | Nakayama | G03F 1/70 702/189 |
| 2014/0282298 | A1* | 9/2014 | Fan | G06F 17/5081 716/53 |
| 2014/0365985 | A1* | 12/2014 | Ishii | G03F 1/70 716/55 |
| 2015/0153641 | A1* | 6/2015 | Nakayama | G06F 17/5072 716/55 |
| 2016/0026743 | A1* | 1/2016 | Ishii | G06F 17/5068 716/55 |

\* cited by examiner

MASK PATTERN GENERATION METHOD AND OPTICAL IMAGE CALCULATION METHOD

BACKGROUND OF THE INVENTION

Field of the Invention

The present invention relates to a mask pattern generation method and an optical image calculation method.

Description of the Related Art

In producing a semiconductor device using a photolithography technology, a projection exposure apparatus has been used which projects, through a projection optical system, a circuit pattern drawn on a mask (reticle) onto a substrate to transfer the circuit pattern to the substrate. In recent years, in accordance with miniaturization of semiconductor devices, a resolution enhancement technique to improve resolving power and depth of focus has been known.

As such a resolution enhancement technique, there has been a method for disposing an assist pattern (assist feature) for assisting the resolution of a target pattern, as well as the target pattern to be formed on a substrate, on a mask.

Japanese Patent Laid-Open Nos. 2004-221594 and 2008-40470 are typical examples of a method for designing an assist pattern on a mask. Japanese Patent Laid-Open No. 2004-221594 describes a method for disposing an assist pattern at a peak position (the position which takes an extreme value) of an interference map obtained by performing a Fourier transform of a first eigenfunction of a four-dimensional transmission cross coefficient (TCC). Japanese Patent Laid-Open No. 2008-40470 describes a method for obtaining an approximate aerial image using a two-dimensional transmission cross coefficient and disposing an assist pattern at a peak position of the approximate aerial image.

However, with the calculation methods using a transmission cross coefficient as described in Japanese Patent Laid-Open Nos. 2004-221594 and 2008-40470, a long calculation time may be required. Therefore, shortening of the calculation time has been demanded.

SUMMARY OF THE INVENTION

According to an aspect of the present invention, a method for generating a pattern of a mask to be used for illuminating the mask with an illumination optical system and projecting an image of the pattern of the mask onto a substrate through a projection optical system, includes the following steps being performed by a processor: setting a pattern on an object plane of the projection optical system; shifting a pupil function representing a pupil of the projection optical system in accordance with a position of a point light source at coordinates on a pupil plane of the projection optical system for individual point light sources on the pupil plane, and generating shifted plural pupil functions; defining a matrix containing the generated plural pupil functions; calculating an image of the pattern on the object plane by generating a vector obtained by transposing and complex-conjugating a vector containing, as components, values of the pupil functions at origin coordinates on the pupil plane from among components of the matrix, and performing convolution integral between the pattern on the object plane and a Fourier transform of a product of the vector and the matrix; and generating, using the calculated image, an assist pattern for the pattern on the object plane, and generating a pattern of the mask including the pattern on the object plane and the assist pattern.

According to another aspect of the present invention, a method for calculating an optical image of a pattern projected onto an image plane through a projection optical system by illuminating a pattern on an object plane with an illumination optical system, includes the following steps being performed by a processor: setting a pattern on the object plane of the projection optical system; shifting a pupil function representing a pupil of the projection optical system in accordance with a position of a point light source at coordinates on a pupil plane of the projection optical system for individual point light sources on the pupil plane, and generating shifted plural pupil functions; defining a matrix containing the generated plural pupil functions; and calculating an optical image of the pattern, by generating a vector obtained by transposing and complex-conjugating a vector containing, as components, values of the pupil functions at origin coordinates on the pupil plane from among components of the matrix, and performing convolution integral between the pattern on the object plane and a Fourier transform of a product of the vector and the matrix.

Further features of the present invention will become apparent from the following description of exemplary embodiments with reference to the attached drawings.

DESCRIPTION OF THE EMBODIMENTS

Figure 1:
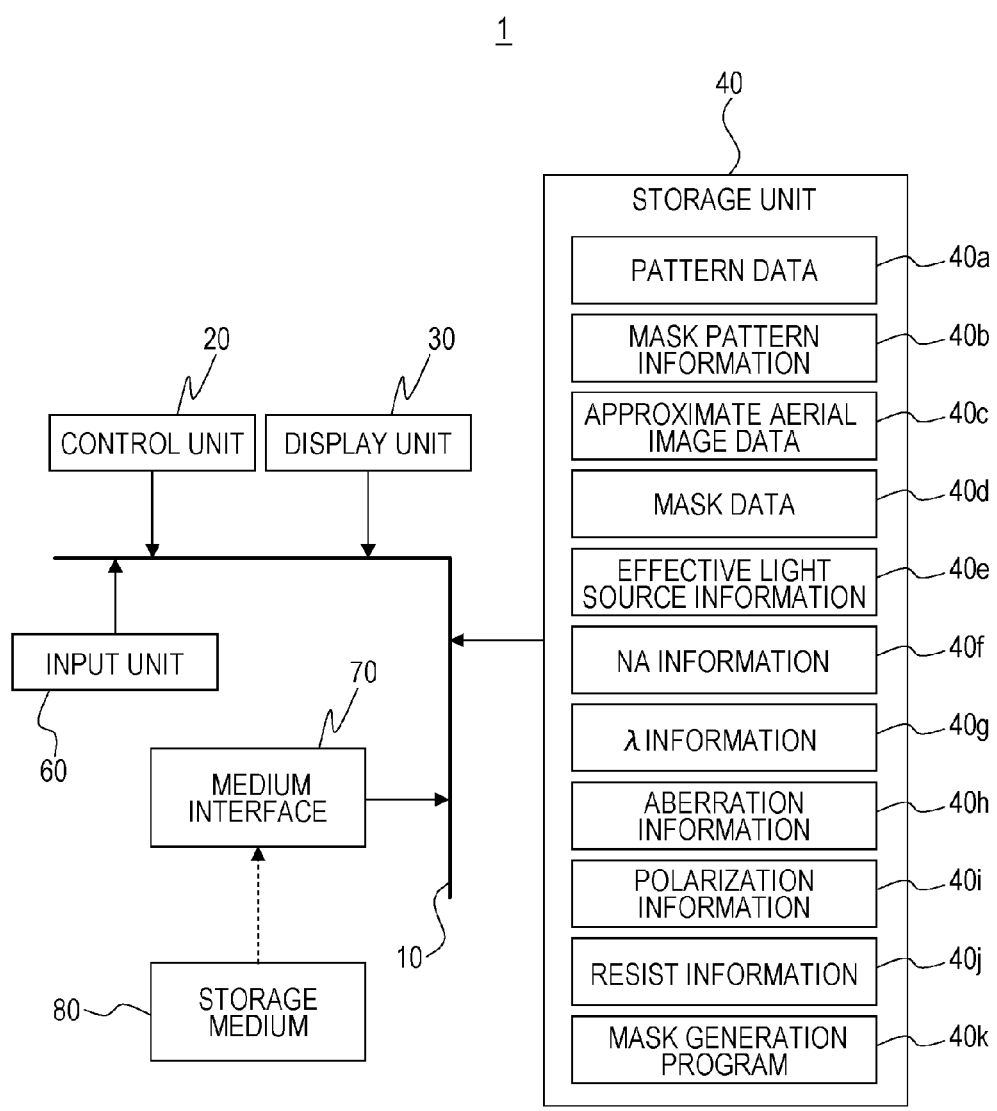
FIG. 1 is a diagram illustrating a configuration of a computer according to an aspect of an embodiment of the present invention.

Various embodiments of the present invention will be described hereinafter with reference to the attached figures.

An embodiment is applicable to, for example, image formation calculation (partial coherent image formation calculation) of an optical system based on partial coherent image formation in an exposure apparatus or a microscope. The embodiment is also applicable to production of various devices, such as semiconductor chips including integrated circuits (ICs) and large-scale integrations (LSIs), display elements including liquid crystal panels, detection elements including magnetic heads, and imaging elements including charge-coupled devices (CCDs) and generation of data of a mask used in micro-mechatronics. Micro-mechatronics represents technologies in which mechanical systems on the order of microns having advanced features are fabricated by applying semiconductor integrated circuit fabrication techniques to microstructure fabrication, and such mechanical systems themselves.

First, coordinate systems of an exposure apparatus according to this embodiment will be explained. In this embodiment, the coordinate systems of the exposure apparatus are categorized into two systems. A first coordinate system represents coordinates on a mask plane (an object plane of a projection optical system) and a substrate plane (an image plane of the projection optical system). In this embodiment, the first coordinate system is represented by (x,y). The difference in the size between a pattern on the mask plane and a pattern on the substrate plane corresponds to a magnification of the projection optical system. For a simplified explanation, however, by multiplying the size of the pattern on the mask plane by the magnification of the projection optical system, the size of the pattern on the mask plane and the size of the pattern on the substrate plane are made correspond to each other at a rate of 1:1. Accordingly, the coordinate system for the mask plane and the coordinate system for the substrate plane correspond to each other at a rate of 1:1. The optical axis direction of the projection optical system is defined as a z-direction. An x-axis, a y-axis, and a z-axis form a three-dimensional orthogonal coordinate system. The second coordinate system represents coordinates on a pupil plane of the projection optical system. In this embodiment, the second coordinate system is represented by (f,g). Further, coordinates (f,g) on the pupil plane of the projection optical system represent a coordinate system normalized such that the size of the pupil of the projection optical system is 1.

With the exposure apparatus, in the state where a mask is not disposed on the object plane of the projection optical system, a light intensity distribution formed on the pupil plane of the projection optical system is called an effective light source distribution, and is represented by S(f,g) in this embodiment. Furthermore, the pupil of the projection optical system is represented by a pupil function P(f,g). In general, information of aberration or polarization may be embedded into the pupil function. It is possible to include the influence of aberration or polarization in the pupil function P(f,g) in this embodiment.

The exposure apparatus illuminates a mask (reticle) with partial coherent illumination, and projects a pattern of the mask onto a substrate (a wafer, a glass substrate, etc.). In this embodiment, a pattern of the mask including transmittance and phase information is defined as o(x,y), and a light intensity distribution (an aerial image) formed on the substrate plane is defined as I(x,y). Further, the amplitude of diffracted light diffracted by the mask pattern is defined as the pupil plane of the projection optical system, and is represented by a(f,g).

Hereinafter, for comparison with this embodiment, a method for calculating an approximate aerial image in the case where a mask is illuminated with polarized light, using the calculation method described in Japanese Patent Laid-Open No. 2008-40470, will be explained. If light from a light source is polarized, a light ray is bent three-dimensionally when passing through an optical system, and light reaching an image plane therefore contains an x-polarization component, a y-polarization component, and a z-polarization component. A bending effect of a light ray may be embedded in a pupil function. Thus, three types of pupil functions, that is, $P_x(f,g)$, $P_y(f,g)$, and $P_z(f,g)$, may be defined. Here, a four-dimensional transmission cross coefficient (TCC) is provided by Equation 1.

$$TCC(f_1, g_1, f_2, g_2) = \\
\int\int S(f,g)P_x^*(f+f_1, g+g_1)P_x(f+f_2, g+g_2)dfdg + \\
\int\int S(f,g)P_y^*(f+f_1, g+g_1)P_y(f+f_2, g+g_2)dfdg + \\
\int\int S(f,g)P_z^*(f+f_1, g+g_1)P_z(f+f_2, g+g_2)dfdg$$

Equation 1

An approximate aerial image $I_{app}(x,y)$ is provided by Equation 2.

$$I_{app}(x,y) = FT[TCC(0,0,f,g)a(f,g)]$$

Equation 2

FT represents a Fourier transform. In Equation 2, a function represented by a TCC(0,0,f,g) is a two-dimensional transmission cross coefficient. A calculation method for multiplying a two-dimensional transmission cross coefficient by diffracted light and then performing a Fourier transform is described in Japanese Patent Laid-Open No. 2008-40470. In calculation of TCC(0,0,f,g) using Equation 1, the product of an effective light source distribution and the complex conjugate of a pupil function is obtained. At this time, the origin of the complex conjugate of the pupil function is made to match the origin of the pupil plane coordinates (that is, the complex conjugate of a pupil function which is not shifted from the origin is defined). Then, convolution integral is performed, using the pupil function, with respect to the product of the effective light source distribution and the complex conjugate of the pupil function.

In contrast, in this embodiment, an approximate aerial image is calculated using a totally different method, without using the convolution integral in Equation 1, in calculation of a two-dimensional transmission cross coefficient. Hereinafter, such a method will be explained. In numerical calculation, a function is sampled (that is, discretized), all the functions are discretized. As a result, an effective light source distribution can be regarded as a collection of point light sources. In this case, different point light sources are incoherent to each other.

Hereinafter, for simplification of discussion, one-dimensional image formation will be considered. The pupil plane coordinates are discretized, and the range of the pupil plane coordinate f is set to $-2 \leq f \leq 2$. Here, M represents the number of sampling points of f. For example, M is set to 7. Since M is set to 7, the positions of seven coordinates to be sampled are $f_1=-2$, $f_2=-4/3$, $f_3=-2/3$, $f_4=0$, $f_5=2/3$, $f_6=4/3$, and $f_7=2$. Among the positions of the seven coordinates, $f_4=0$ represents the origin of the pupil plane and is a point on the optical axis of the projection optical system. Further, as the simplest example, an effective light source distribution is formed of two point light sources having an intensity of 1, and the points are positioned at $f=f_4$ and $f=f_5$. A method for calculating an approximate aerial image under the above-mentioned conditions will be explained below.

First, a case where polarization is not taken into consideration will be considered. A pupil with no aberrations functions to transmit light within a range of $-1 \leq f \leq 1$ and block light within a range of $|f|>1$. Therefore, the discretized pupil function is represented by Equation 3.

$$P(f)=(0011100)$$

Equation 3

Components in Equation 3 represent values on the coordinates $f_1$, $f_2$, $f_3$, $f_4$, $f_5$, $f_6$, and $f_7$, in the order from left to right.

For example, light from the point light source at $f=f_4=0$ (origin) on the effective light source distribution is vertically applied to a mask. In this case, therefore, the pupil function is not shifted and is maintained in the state represented by Equation 3. At this time, the discretized pupil function is regarded as a vector, and a vector $P_1$ is defined as Equation 4.

As an attribute of illumination, off-axis illumination is regarded as shifting a pupil function. The point light source positioned at $f=f_5$ on the effective light source distribution is off-axis illumination. Therefore, the point light source can be regarded as shifting the pupil function by the distance from the origin to the position $f_s$ of the point light source. As a result, the shifted pupil function is discretized, and a vector $P_2$ is defined as Equation 5.

$$P_2 = (0001110) \qquad \text{Equation 5}$$

The vectors $P_1$ and $P_2$ are arranged in individual rows and stacked, and a vector $P$ is defined as Equation 6.

$$P = \begin{pmatrix} 0 & 0 & 1 & 1 & 1 & 0 & 0 \\ 0 & 0 & 0 & 1 & 1 & 1 & 0 \end{pmatrix} \qquad \text{Equation 6}$$

The center column of the vector $P$ represents a vector which contains, as components, values of pupil functions at the origin $f_4$ on the pupil plane coordinates. A vector $P_c$, which is an extraction of the center column, is defined as Equation 7.

$$P_c = \begin{pmatrix} 1 \\ 1 \end{pmatrix} \qquad \text{Equation 7}$$

When $T_c$ represents the product (matrix product) of the transposed conjugate of the vector $P_c$ (a vector is transposed, and components of the transposed vector are complex-conjugated, represented by a superscript †) and the vector $P$, $T_c$ is represented by Equation 8.

$$\begin{aligned} T_c &= P_c^\dagger P \qquad \text{Equation 8} \\ &= (1\ 1)\begin{pmatrix} 0 & 0 & 1 & 1 & 1 & 0 & 0 \\ 0 & 0 & 0 & 1 & 1 & 1 & 0 \end{pmatrix} \\ &= (0\ 0\ 1\ 2\ 2\ 1\ 0) \end{aligned}$$

The matrix $P$ contains, as components of each row, pupil functions which are shifted from the origin by the amounts of shifts of the positions of the point light sources, in association with the positions of the point light sources (mask illumination conditions). In order to calculate the convolution integral in Equation 1, a pupil function is shifted and double integral is performed. However, the matrix $P$ can be regarded as having effects of shifting a pupil function. The vector $P_c$ corresponds to the complex conjugate of the pupil function at the origin of the pupil plane. The matrix product $T_c$ of the vector $P_c$ and the matrix $P$ can be regarded as the product of the complex conjugate of the pupil function whose origin is not shifted and all the pupil functions which are shifted in association with the positions of the point light sources. Therefore, $T_c$, which is the matrix product of the vector $P_c$ and the matrix $P$, corresponds to the two-dimensional transmission cross coefficient TCC(0,0,f,g).

Accordingly, when $T_c$ represents a value obtained by discretizing a function $T_c(f)$, an approximate aerial image $I_{app}(x)$ is provided by Equation 9. That is, a Fourier transform of the matrix product of the vector $P_c$ and the matrix $P$ is performed.

$$\begin{aligned} I_{app}(x) &= FT[T_c(f)a(f)] \qquad \text{Equation 9} \\ &= FT[T_c(f)] \otimes o(f) \end{aligned}$$

where, $\otimes$ represents convolution integral.

That is, when a Fourier transform of the matrix product $T_c$ of the vector $P_c$ and the matrix $P$ is performed and convolution integral with a pattern on the object plane is calculated, an approximate aerial image (image distribution) is obtained. Performing a Fourier transform of the matrix product $T_c$ of the vector $P_c$ and the matrix $P$ and calculating convolution integral with a pattern of a mask and the Fourier transform of the matrix product $T_c$ is equivalent to multiplying the matrix product $T_c$ by the amplitude of diffracted light which is diffracted by the pattern of the mask and performing a Fourier transform, and they are exchangeable.

Next, a discussion is expanded to a case where a mask is illuminated with desired polarized illumination and a two-dimensional (f,g) image is formed. A pupil with no aberrations functions to transmit light within a range of $-1 \le (f^2+g^2)^{1/2} \le 1$ and block light within a range of $(f^2+g^2)^{1/2} > 1$. In the case where circ(r) represents a function which takes 1 when r is smaller than or equal to 1 and takes 0 when r is greater than 1, a pupil function without no aberrations is represented by circ$((f^2+g^2)^{1/2})$. When aberration is represented by W(f, g), since aberration provides light passing through the pupil with a phase difference, a pupil function having aberration is represented by circ$((f^2+g^2)^{1/2})$exp$(-iW(f,g))$. When the pupil has a transmittance distribution h(f,g), the pupil function is represented by h(f,g)circ$((f^2+g^2)^{1/2})$exp$(-iW(f,g))$. An optical attribute of a resist can be regarded as aberration and a transmittance distribution of the pupil. Further, when illumination light is polarized, a light ray is bent three-dimensionally, and an x-polarization component, a y-polarization component, and a z-polarization component are thus generated. By multiplying a pupil function having aberration and a transmittance distribution by a function expressing how the x-polarization component is generated, a pupil function $P_x(f,g)$ of the x-polarization component can be defined. A pupil function $P_y(f,g)$ of the y-polarization component and a pupil function $P_z(f,g)$ of the z-polarization component can be defined in a similar manner.

In the case of two-dimensional image formation, the pupil plane is sampled to M×M. As a result of such sampling, an effective light source distribution is formed of N point light sources. When the position of the j-th point light source is defined as $(f'_j, g'_j)$, the j-th point light source can be regarded as shifting the pupil by $(f'_j, g'_j)$. As a result, pupil functions of individual polarization components are defined as $P_x(f-f'_j, g-g'_j)$, $P_y(f-f'_j, g-g'_j)$, and $P_z(f-f'_j, g-g'_j)$. When the individual pupil functions are sampled, an array of M×M can be obtained. By introducing an operator Y (stacking operator Y) which rearranges a matrix of M rows and M columns into a matrix of 1 row and $M^2$ columns in accordance with a certain rule, a matrix $P_j$ of 3 rows and $M^2$ columns is defined as Equation 10.

$$P_j = \begin{pmatrix} \sqrt{S(f'_j, g'_j)}\, Y[P_x(f-f'_j, g-g'_j)] \\ \sqrt{S(f'_j, g'_j)}\, Y[P_y(f-f'_j, g-g'_j)] \\ \sqrt{S(f'_j, g'_j)}\, Y[P_z(f-f'_j, g-g'_j)] \end{pmatrix} \qquad \text{Equation 10}$$

Furthermore, by stacking $P_j$, the matrix $P$ of 3N rows and $M^2$ columns is defined as Equation 11.

$$P = \begin{pmatrix} P_1 \\ P_2 \\ \vdots \\ P_N \end{pmatrix} \qquad \text{Equation 11}$$

The center column of the matrix P represents a vector which contains, as components, values of pupil functions at the origin of the pupil plane coordinates. The matrix product of the transposed conjugate of the vector $P_c$, which is an extraction of the center column, and the matrix P is represented by $T_c$. $T_c$ is an array of 1 row and $M^2$ columns. By causing counteraction of the stacking operator Y, $T_c$ may be regarded as being obtained by sampling a function $T_c(f,g)$ at M×M points. By multiplying $T_c(f,g)$ by a diffracted light distribution from a mask and performing a Fourier transform, or by performing a Fourier transform of $T_c(f,g)$ and calculating convolution integral with a target pattern, an approximate aerial image with polarized illumination and at the time of two-dimensional image formation can be obtained as Equation 12.

$$I_{app}(x, y) = FT[T_c(f, g)a(f, g)] \qquad \text{Equation 12}$$
$$= FT[T_c(f, g)] \otimes o(f, g)$$

In the above description, it is assumed that the stacking operator Y disposes a sampling point corresponding to the origin of the pupil plane at the $(M^2+1)/2$-th position (that is, the center column of the matrix P). If the stacking operator Y disposes the sampling point corresponding to the origin of the pupil plane at the L-th position, a vector which is obtained by extracting the L-th column of the matrix P may be defined as $P_c$. In the above-mentioned definition of the matrix, rows and columns are exchangeable.

A reason why a calculation time is shortened in this embodiment will be explained in detail below. A tremendous amount of calculation is required to obtain a four-dimensional transmission cross coefficient TCC. Double integral is to be performed to obtain a transmission cross coefficient TCC at a certain point $(f_1,g_1,f_2,g_2)$. Further, when the pupil plane is divided into M×M, double integral is to be performed $M^2$ times to calculate a two-dimensional transmission cross coefficient TCC (0,0,f,g). Therefore, a large amount of calculation and a long calculation time are required. In the actual exposure apparatus, aberration remains in the projection optical system, and polarized light may be used as illumination light for a mask. Therefore, polarized light for illumination and aberration of the projection optical system are to be taken into consideration. In such a case, double integral is to be performed three times to obtain a transmission cross coefficient TCC at a certain point $(f_1,g_1,f_2,g_2)$, as represented by Equation 1. In the case where the pupil plane is divided into M×M, double integral is to be performed $3M^2$ times to calculate a two-dimensional transmission cross coefficient TCC(0,0,f,g). Therefore, a large amount of calculation and a long calculation time may be required.

In contrast, in order to obtain the matrix P described in Equation 11, it is only necessary to arrange pupil functions which have been shifted in association with positions of point light sources in individual rows and to stack the shifted pupil functions. Therefore, complicated double integral, which requires a large amount of calculation, is not necessary. Furthermore, the matrix product of the transposed conjugate of $P_c$ and the matrix P is easily executable by a computer, and the amount of calculation is small. Accordingly, it is obvious that this embodiment can be implemented with a small amount of calculation and a short calculation time, compared to the calculation methods described in Japanese Patent Laid-Open Nos. 2004-221594 and 2008-40470.

The matrix P described in Equation 11 is described, for example, in Japanese Patent No. 4402145, which is an invention relating to a method for performing singular value decomposition of a matrix P to calculate an optical image and a method for determining the position where an assist pattern is to be disposed in accordance with an eigenfunction of the matrix P. However, Japanese Patent No. 4402145 does not describe calculation of the matrix product of the transposed conjugate of a vector $P_c$, which is an extraction of the center column of the matrix P, and the matrix P, and differs from this embodiment in the above-mentioned point.

Next, a method for determining a pattern of a mask using an approximate aerial image obtained in this embodiment, will be explained.

As described in Japanese Patent Laid-Open No. 2008-40470, the value of an approximate aerial image represents the degree of intensification (or weakening). Therefore, by disposing an assist pattern having the same phase as a target pattern to be formed on a substrate at a position at which the approximate aerial image has a peak and positive value, the intensity of the target pattern on the image plane can be intensified. In contrast, by disposing an assist pattern having the phase opposite the target pattern (a phase difference of 180 degrees) at a position at which the approximate aerial image has a peak and negative value, the intensity of the target pattern on the image plane can be intensified.

Further, by obtaining the Laplacian (second-order differential regarding a position) of the approximate aerial image, an assist pattern may be disposed at the peak position. When the Laplacian is operated on the approximate aerial image described in Equation 12, the Laplacian is a linear operator, and Equation 13 can thus be obtained.

$$\nabla^2 I_{app}(x,y) = FT[T_c(f,g)] \otimes [\nabla^2 o(f,g)] \qquad \text{Equation 13}$$

$\nabla^2 o(f,g)$ corresponds to that the edge of the target pattern is enhanced. That is, the Laplacian of the approximate aerial image represents a position which enhances the edge of the target pattern. Therefore, with a relatively large target pattern or a target pattern such as a line, calculating the Laplacian of the approximate aerial image and disposing the assist pattern at the peak position, is effective. As described above, by generating an assist pattern using the approximate aerial image obtained in this embodiment, the resolving power or depth of focus of the target pattern can be improved.

The approximate aerial image $I_{app}(x,y)$ described in Equation 12 is an approximate aerial image obtained by approximate calculation in a state where the origin of the complex conjugate of a pupil function is fixed at the origin of the pupil plane coordinates, and is effective for generation of an assist pattern. Meanwhile, it was found that the square of the absolute value of the approximate aerial image $I_{app}(x,y)$ is a more approximate value of an optical image obtained by projecting a pattern on the object plane onto the image plane. That is, by squaring the absolute value on the right side of Equation 12, an optical image (aerial image) on the image plane can be calculated with high accuracy.

Next, a configuration of a computer for executing a program for generating a pattern of a mask according to this embodiment will be explained with reference to FIG. 1.

A computer (information processing apparatus) 1 includes bus wiring 10, a control unit 20, a display unit 30, a storage unit 40, an input unit 60, and a medium interface 70. The control unit 20, the display unit 30, the storage unit 40, the input unit 60, and the medium interface 70 are connected to one another through the bus wiring 10. The medium interface 70 is configured to be able to be connected with a storage medium 80. The control unit 20 includes a central processing unit (CPU), a graphics processing unit (GPU), a digital signal processor (DSP), or a microcomputer, and includes a cache memory for temporary storage, and the like. The display unit 30 includes, for example, a display device such as a liquid crystal display. The storage unit 40 is, for example, a memory and a hard disk. The input unit 60 includes, for example, a keyboard, a mouse, and the like. The medium interface 70 is, for example, a compact disc-read only memory (CD-ROM) drive, a universal serial bus (USB) interface, and the like. The storage medium 80 includes, a CD-ROM, a USB memory, and the like. Pattern data 40a, mask pattern information 40b, approximate aerial image data 40c, mask data 40d, effective light source information 40e, NA information 40f, λ information 40g, aberration information 40h, polarization information 40i, and resist information 40j are stored in the storage unit 40. A mask generation program 40k is also stored in the storage unit 40. The above-mentioned information is read out for calculation processing by the control unit 20, where necessary.

The pattern data 40a is data of a pattern which is layout-designed based on designing of an integrated circuit (may also be called a layout pattern or a target pattern to be formed on a substrate). The mask pattern information 40b is information of a pattern on the object plane necessary for calculating an approximate aerial image. The mask pattern information 40b is a target pattern itself or is obtained by performing predetermined processing and changing the target pattern. The approximate aerial image data 40c is data of a calculated approximate aerial image. The mask data 40d is drawing data which is obtained by performing conversion of data of a pattern generated by the mask generation program 40k so that a mask producing apparatus can draw a pattern such as Cr on mask blanks. The effective light source information 40e is information of an intensity distribution of light formed on a pupil plane 142 of a projection optical system 140 in an exposure apparatus 100 (see FIG. 5), which will be described later. The NA information 40f is information of an image-side numerical aperture NA of the projection optical system 140. The λ information 40g is information of a wavelength λ of exposure light. The aberration information 40h is information of aberration of the projection optical system 140. The polarization information 40i is information of polarization of illumination light of an illumination device (illumination optical system) 110. The resist information 40j is information of a resist applied on a substrate 174. The mask generation program 40k is a program for generating, with a computer 1, a pattern of a mask.

Figure 2:
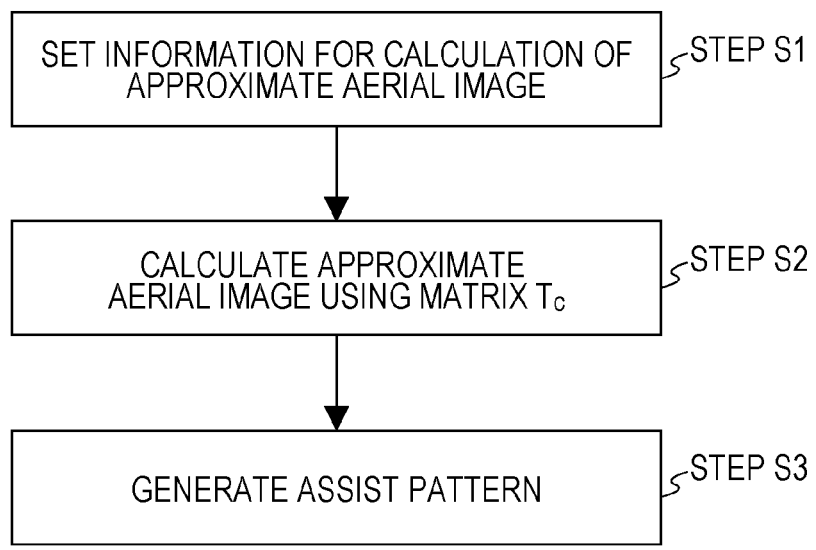
FIG. 2 is a flowchart illustrating a method for generating a mask pattern according to the embodiment.

Next, the flow of a process for generating a pattern of a mask in accordance with execution of the mask generation program 40k will be explained with reference to a flowchart of FIG. 2. It is assumed that the mask generation program 40k is installed from the storage medium 80 connected to the medium interface 70 and stored in the storage unit 40 via the control unit 20. Further, the mask generation program 40k is started in accordance with a start instruction received from a user through the input unit 60, and is executed by the control unit 20.

In step S1, the control unit 20 of the computer 1 sets information for calculating the approximate aerial image 40c. The information for calculating the approximate aerial image 40c includes the effective light source information 40e, the NA information 40f, the λ information 40g, the aberration information 40h, the polarization information 40i, the resist information 40j, and the mask pattern information 40b. Specifically, the user inputs, through the input unit 60, the effective light source information 40e (for example, an effective light source distribution in FIG. 3A), the λ information 40g (for example, 248 nm), the polarization information 40i (for example, x-polarization), and the resist information 40j (for example, no consideration). The user also inputs the mask pattern information 40b, the NA information 40f (for example, 0.73), and the aberration information 40h (for example, no aberrations). The control unit 20 causes the received information for calculation of the approximate aerial image 40c to be stored in the storage unit 40.

Figure 3A:
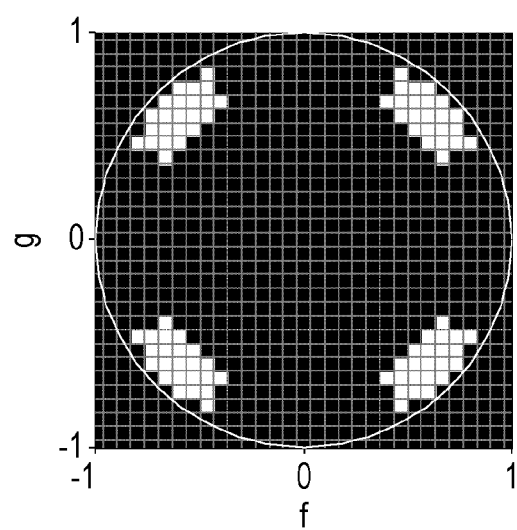
FIG. 3A is a diagram illustrating an effective light source distribution.
Figure 3B:
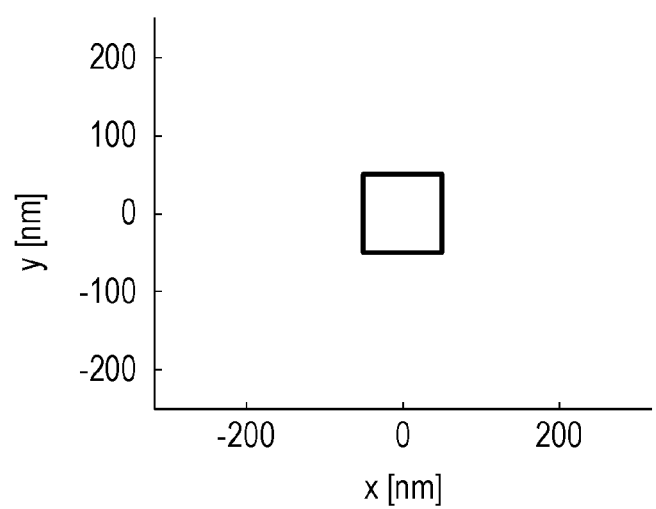
FIG. 3B is a diagram illustrating a hole pattern.

FIG. 3A represents a light intensity distribution (effective light source distribution) on pupil plane coordinates f,g. In FIG. 3A, white portions represent bright portions, and black portions represent dark portions. For example, in the case where the user wants to form a contact hole of 100 nm on the substrate, the pattern data 40a is, for example, a hole pattern with a rectangular aperture of 100 nm on each side, as illustrated in FIG. 3B. However, since it is important for exposure of a hole pattern to focus light onto one point, a rectangular aperture of 1 nm on each side is used as the mask pattern information 40b. Further, the number M of pupil samplings on the pupil plane is set to 31, and light from all the point light sources is x-polarization.

Figure 4A:
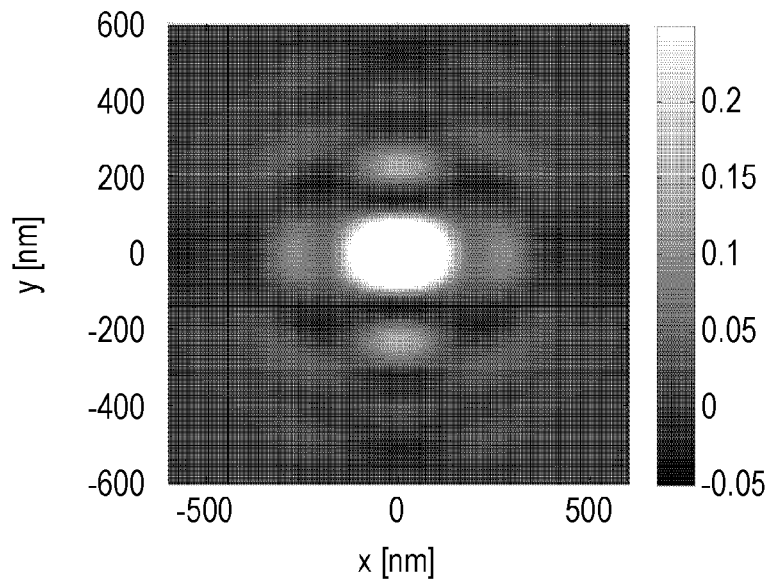
FIG. 4A is a diagram illustrating an approximate aerial image.

In step S2, the control unit 20 generates the approximate aerial image 40c. Specifically, the user inputs a generation instruction for the approximate aerial image 40c to the input unit 60. The control unit 20 receives the generation instruction for the approximate aerial image 40c, and refers to the storage unit 40 on the basis of the generation instruction. The control unit 20 receives from the storage unit 40 the information for calculation of the approximate aerial image 40c determined in step S1. The control unit 20 calculates the approximate aerial image 40c based on the information for calculation of the approximate aerial image 40c. For example, a matrix $T_c$ is obtained using the above-mentioned method for calculating an approximate aerial image and Equations 10 and 11, and the approximate aerial image 40c is calculated using Equation 12. FIG. 4A illustrates a calculation result of the approximate aerial image 40c. FIG. 4A represents the image intensity of the approximate aerial image on the x,y coordinates on the image plane. Further, the control unit 20 causes the approximate aerial image 40c to be displayed on the display unit 30. The control unit 20 also causes the information of the calculated approximate aerial image 40c to be stored in the storage unit 40.

Figure 4B:
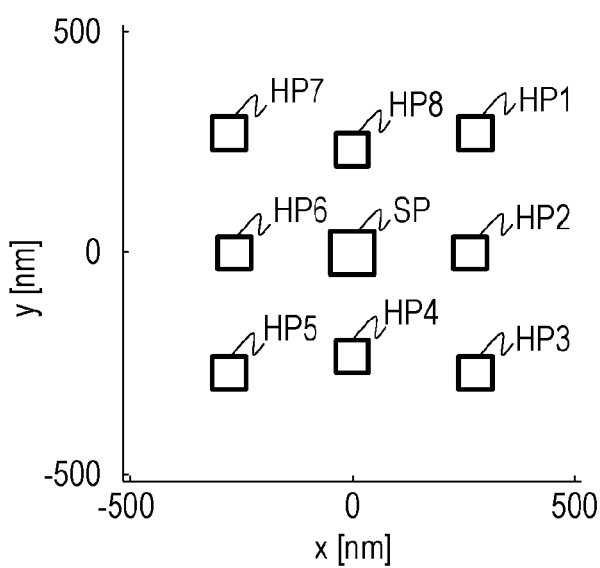
FIG. 4B is a diagram illustrating a generated mask pattern.

In step S3, the control unit 20 generates an assist pattern. Specifically, the user who has viewed the approximate aerial image 40c superimposed on the pattern data 40a displayed on the display unit 30, inputs a generation instruction for an assist pattern to the input unit 60. The control unit 20 receives the generation instruction for the assist pattern, and additionally disposes the assist pattern at a position at which the approximate aerial image 40c has a peak value, in accordance with the received instruction. With this processing, a pattern in which assist patterns HP1 to HP8 are disposed around a pattern SP of the pattern data 40*a*, can be generated, as illustrated in FIG. 4B. The individual assist patterns may be rectangular patterns of sizes with which the patterns are not resolved.

The control unit 20 determines the pattern generated in step S3 as the pattern of the mask, and causes the generated pattern to be displayed on the display unit 30. The control unit 20 also converts the pattern of the mask generated in step S3 into the mask data 40*d* for producing a mask. The converted mask data 40*d* is stored into the storage unit 40.

Effects of this embodiment will be described below. Calculation of an approximate aerial image using the calculation method described in Japanese Patent Laid-Open No. 2008-40470 requires about 80.5 seconds. In contrast, calculation of an approximate aerial image using the calculation method according to this embodiment requires about 4.9 seconds. Accordingly, the calculation time is shortened by 94% in this embodiment. Further, the difference between the approximate aerial image obtained using the calculation method described in Japanese Patent Laid-Open No. 2008-40470 and the approximate aerial image obtained using the calculation method according to this embodiment, the difference being obtained by normalizing the maximum values of these approximate aerial images to 1, is on the order of $10^{-15}$, which can be regarded as an error in numerical calculation. Therefore, the approximate aerial images obtained using these calculation methods can be considered to be substantially the same. The above-mentioned calculations are performed with a Windows® XP 64-bit computer with an AMD's Opteron CPU at a clock speed of 2.99 GHz.

As described above, with the processing based on the mask generation program 40*k* according to this embodiment, an approximate aerial image can be calculated using the above-mentioned calculation method, in particular, Equation 12, without performing convolution integral for calculating a two-dimensional transmission cross coefficient. Therefore, the calculation time for an approximate aerial image can be shortened. Consequently, the time required for generating a pattern of a mask can also be shortened. Furthermore, a calculation result of an approximate aerial image by the calculation method described in Japanese Patent Laid-Open No. 2008-40470 and a calculation result of an approximate aerial image by the calculation method according to this embodiment are substantially the same within an error range of numerical calculation. Therefore, the position of an assist pattern can be determined accurately using the calculation method according to this embodiment.

Furthermore, a program for calculating an optical image can also be executed using the computer 1. That is, the control unit 20 of the computer 1 is able to calculate an optical image (aerial image) on the image plane of the mask pattern with a rectangular aperture of 1 nm on each side, by calculating the approximate aerial image 40*c* based on information for calculation of the approximate aerial image 40*c* and then squaring the absolute value of the approximate aerial image 40*c*. The calculated optical image is displayed on the display unit 30 and is used for evaluation of the optical image. Further, based on the calculated optical image, correction of the shape and position of the mask pattern, correction of illumination conditions for the mask, correction of a parameter of an exposure process, and the like can be performed.

Figure 5:
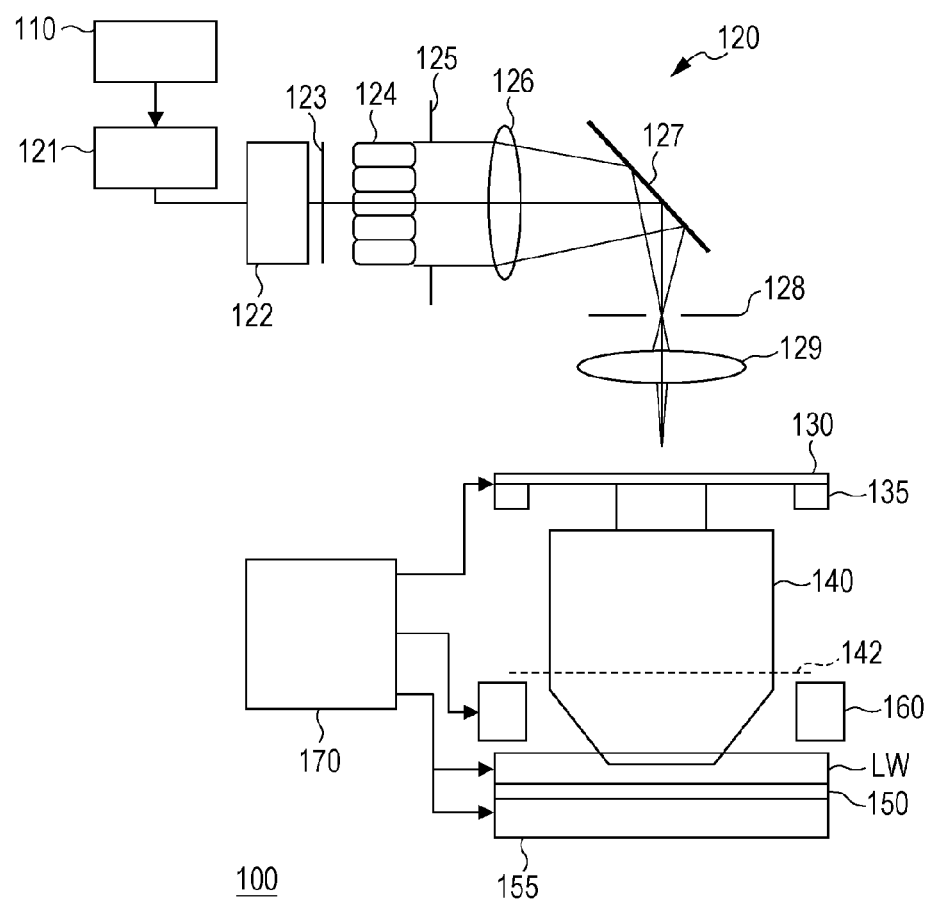
FIG. 5 is a schematic block diagram of an exposure apparatus according to an aspect of the embodiment.

Next, the exposure apparatus 100 which performs exposure processing using a mask produced based on a mask pattern generated in this embodiment as described above, will be explained with reference to FIG. 5. FIG. 5 is a schematic block diagram illustrating a configuration of the exposure apparatus 100.

The mask data 40*d* generated based on the mask generation program 40*k* according to this embodiment is input to a mask producing apparatus, such as an electron beam lithography apparatus. The mask producing apparatus draws a pattern on mask blanks, based on the mask data 40*d*, to produce a mask.

The exposure apparatus 100 is a liquid immersion exposure apparatus which exposes a pattern of a mask 130 to a wafer 150 through liquid LW supplied between the projection optical system 140 and the wafer 150, using a step-and-scan method. The exposure apparatus 100 may also employ a step-and-repeat method and other exposure methods. The exposure apparatus 100 includes a light source 110, an illumination optical system 120, a mask stage 135 for retaining the mask 130, the projection optical system 140, a wafer stage 155 for retaining the wafer 150, a liquid supply and recovery unit 160, and a main control system 170. The light source 110 and the illumination optical system 120 form an illumination device which illuminates the mask 130 on which a circuit pattern to be transferred is formed. In the exposure apparatus 100, the illumination optical system 120 illuminates the mask 130 using light from the light source 110. With the projection optical system 140, diffracted light from the mask 130 forms an image on the wafer 150 through the liquid LW.

The light source 110 may be an excimer laser, such as an ArF excimer laser with a wavelength of about 193 nm or a KrF excimer laser with a wavelength of about 248 nm. The type of the light source 110 and the number of light sources 110 are not limited. For example, an $F_2$ laser with a wavelength of about 157 nm may be used as the light source 110.

The illumination optical system 120 is an optical system which illuminates the mask 130 using light flux from the light source 110. The illumination optical system 120 includes a beam shaping optical system 121, a condensing optical system 122, a polarization control unit 123, an optical integrator 124, and an aperture diaphragm 125. The illumination optical system 120 also includes a condensing lens 126, a bending mirror 127, a masking blade 128, and an imaging lens 129. The illumination optical system 120 is able to implement various illumination modes including modified illumination (quadrupole illumination, dipole illumination, etc.).

The beam shaping optical system 121 may be, for example, a beam expander including plural cylindrical lenses. The beam shaping optical system 121 converts the aspect ratio of the cross-sectional shape of parallel light from the light source 110 into a predetermined value (for example, the cross-sectional shape is changed from a rectangle into a square). The beam shaping optical system 121 performs shaping into light flux having the size and divergent angle required for illuminating the optical integrator 124.

The condensing optical system 122 includes plural optical elements, and guides light shaped by the beam shaping optical system 121 to the optical integrator 124 efficiently. The condensing optical system 122 includes, for example, a zoom lens system, and adjusts the distribution of the shape and angle of light flux to be incident to the optical integrator 124.

The polarization control unit 123 includes, for example, a polarization element, and is disposed at a position which is substantially conjugate to the pupil plane 142 of the projection optical system 140. The polarization control unit 123 controls the polarization state of a predetermined region of an effective light source distribution formed on the pupil plane 142 of the projection optical system 140.

The optical integrator 124 has a function to make an illumination light distribution of illumination of the mask 130 uniform and perform emission by converting the angular distribution of incident light into positional distribution. The optical integrator 124 may be, for example, a fly-eye lens which maintains the Fourier transform relationship between the incidence plane and the emission plane. A fly-eye lens is a combination of plural rod lenses (that is, microlens elements). However, the optical integrator 124 is not limited to a fly-eye lens. The optical integrator 124 may be an optical rod, a diffraction grating, a cylindrical lens array plate in which individual pairs are orthogonal to each other.

The aperture diaphragm 125 is disposed at a position which is immediately after the emission plane of the optical integrator 124 and which is substantially conjugate to an effective light source formed on the pupil plane 142 of the projection optical system 140. The aperture shape of the aperture diaphragm 125 corresponds to a light intensity distribution (that is, an effective light source) formed on the pupil plane 142 of the projection optical system 140. In other words, the aperture diaphragm 125 controls the effective light source. The aperture diaphragm 125 is configured to be switchable in accordance with an illumination mode. Instead of using the aperture diaphragm, a diffraction optical element (computer generated hologram (CGH)) or a prism (conical prism etc.) may be disposed in a previous stage of the optical integrator 124 so that an effective light source can be formed.

The condensing lens 126 collects light flux which has been emitted from a secondary light source formed near the emission plane of the optical integrator 124 and has passed through the aperture diaphragm 125, and uniformly illuminates the masking blade 128 via the bending mirror 127.

The masking blade 128 is disposed at a position which is substantially conjugate to the mask 130, and includes plural movable light shielding plates. The masking blade 128 forms an aperture having a substantially rectangular shape corresponding to the effective area of the projection optical system 140. The light flux which has passed through the masking blade 128 is used as illumination light for illumination of the mask 130. The imaging lens 129 forms on the mask 130 an image of the light flux which has passed through the aperture of the masking blade 128.

A pattern of the mask 130 includes a pattern which is actually formed by drawing, with the mask producing apparatus, a pattern of a mask generated by the above-described mask generation program. The mask 130 is supported and driven by the mask stage 135. Diffracted light from the mask 130 is projected onto the wafer 150 through the projection optical system 140. The mask 130 and the wafer 150 are disposed at positions which are optically conjugate to each other. The exposure apparatus 100 is an exposure apparatus using the step-and-scan method. Therefore, by performing synchronous scanning of the mask 130 and the wafer 150, a circuit pattern of the mask 130 to be transferred is transferred to the wafer 150. In the case where the exposure apparatus 100 is an exposure apparatus using the step-and-repeat method, the exposure apparatus 100 performs exposure in the state where the mask 130 and the wafer 150 are stationary.

The mask stage 135 supports the mask 130 via a mask chuck, and is connected to a driving mechanism, which is not illustrated in FIG. 5. The driving mechanism includes, for example, a linear motor, and drives the mask stage 135 in an X-axis direction, a Y-axis direction, a Z-axis direction, and rotating directions of the individual axes. A scanning direction within the plane of the mask 130 or the wafer 150 is represented by the Y-axis direction, a direction perpendicular to the Y-axis is represented by the X-axis direction, and a direction perpendicular to the plane of the mask 130 or the wafer 150 is represented by the Z-axis direction.

The projection optical system 140 is an optical system which projects a circuit pattern of the mask 130 onto the wafer 150. The projection optical system 140 may be a refractive system, a catadioptric system, or a reflection system. Coating for reducing (for being protected from) the influence of the liquid LW supplied from the liquid supply and recovery unit 160, is applied to the final lens (final plane) of the projection optical system 140.

The wafer 150 is a substrate onto which the circuit pattern of the mask 130 is projected (transferred). The wafer 150 may be replaced with a glass plate or a substrate of a different type. A resist is applied to the wafer 150. The wafer stage 155 supports the wafer 150. Similar to the mask stage 135, the wafer stage 155 moves, using a linear motor, the wafer 150 in the X-axis direction, the Y-axis direction, the Z-axis direction, and rotating directions of the individual axes.

The liquid supply and recovery unit 160 has a function to supply the liquid LW to a space between the final lens (final plane) of the projection optical system 140 and the wafer 150. The liquid supply and recovery unit 160 also has a function to recover the liquid LW which has been supplied to the space between the final lens of the projection optical system 140 and the wafer 150.

The main control system 170 includes a CPU and a memory, and controls the operation of the exposure apparatus 100. For example, the main control system 170 is electrically connected with the mask stage 135, the wafer stage 155, and the liquid supply and recovery unit 160, and controls synchronous scanning of the mask stage 135 and the wafer stage 155. The main control system 170 also controls switching among supply, recovery, and stoppage of the liquid LW, in accordance with the scanning direction and speed of the wafer stage 155 at the time of exposure. Furthermore, information of an effective light source distribution in the foregoing embodiment is input to the main control system 170, and the main control system 170 controls the aperture diaphragm, the diffraction optical element, the prism, and the like to form an effective light source distribution. The information of the effective light source distribution may be input by a user. Alternatively, the computer 1 and the exposure apparatus 100 may be connected to each other so that data communication can be performed, and the computer 1 may transmit the information of the effective light source distribution to the exposure apparatus 100. In the case where the computer 1 and the exposure apparatus 100 are connected to each other so that data communication can be performed, a well-known data receiving unit is provided in the exposure apparatus 100 and a well-known data transmitting unit is provided in the computer 1. The above-described computer 1 may be a computer disposed outside the exposure apparatus 100. The main control system 170 may have the above-mentioned functions of the computer 1.

Next, a method for producing, using the above-described exposure apparatus, a device (semiconductor IC element, a liquid crystal display element, etc.) will be explained. A device is produced, using the above-described exposure apparatus, by a step of exposing a substrate (a wafer, a glass substrate, etc.) to which a photosensitive agent is applied, a step of developing the substrate (photosensitive agent), and other well-known steps. The other well-known steps include etching, resist stripping, dicing, bonding, packaging, and the like. With this device producing method, a device with a higher quality than related art can be produced.

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

Various embodiments of the present invention have been described above. It is obvious that the present invention is not limited to the foregoing embodiments and various modifications and changes may be made to the present invention within the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-234253, filed Nov. 12, 2013, which is hereby incorporated by reference herein in its entirety.

What is claimed is:

1. A method for generating a pattern of a mask to be used for a mask manufacturing method for manufacturing the mask using the generated pattern of the mask, the method comprising the following steps being performed by a processor:

setting a pattern on an object plane of the projection optical system;

shifting a pupil function representing a pupil of the projection optical system in accordance with a position of a point light source at coordinates on a pupil plane of the projection optical system for individual point light sources on the pupil plane, and generating shifted plural pupil functions;

defining a matrix containing the generated plural pupil functions;

generating a vector obtained by transposing and complex-conjugating a vector containing, as components, values at an origin coordinate on the pupil plane from among components of the matrix;

calculating an image of the pattern on the object plane by performing convolution integral between the pattern on the object plane and a Fourier transform of a product of the generated vector and the matrix; and generating, using the calculated image, an assist pattern for the pattern on the object plane, and generating a pattern of the mask including the pattern on the object plane and the assist pattern, wherein the mask manufacturing method comprises a step of manufacturing the mask including the generated pattern using data of the generated pattern.

2. The method according to claim 1, wherein the matrix is defined by arranging the plural pupil functions in individual rows or individual columns.

3. The method according to claim 1, wherein light from the point light sources is polarized light, and the pupil functions include three functions corresponding to axes of three-dimensional coordinates.

4. A mask producing method comprising:

generating, using the method according to claim 1, a pattern of a mask; and producing a mask using data of the generated pattern of the mask.

5. An exposure method comprising:

producing a mask using the mask producing method according to claim 4; and projecting a pattern of the produced mask onto a substrate, and performing exposure.

6. A device producing method comprising:

exposing a substrate using the exposure method according to claim 5; and developing the exposed substrate.

7. A non-transitory storage medium storing a program that causes a computer to execute a generation method for generating a pattern of a mask to be used for a mask manufacturing method for manufacturing the mask using the generated pattern of the mask, the method comprising:

setting a pattern on an object plane of the projection optical system;

shifting a pupil function representing a pupil of the projection optical system in accordance with a position of a point light source at coordinates on a pupil plane of the projection optical system for individual point light sources on the pupil plane, and generating shifted plural pupil functions;

defining a matrix containing the generated plural pupil functions;

generating a vector obtained by transposing and complex-conjugating a vector containing, as components, values an origin coordinates on the pupil plane from among components of the matrix;

calculating an image of the pattern on the object plane by performing convolution integral between the pattern on the object plane and a Fourier transform of a product of the generated vector and the matrix; and generating, using the calculated image, an assist pattern for the pattern on the object plane, and generating a pattern including the pattern on the object plane and the assist pattern, wherein the mask manufacturing method comprises a step of manufacturing the mask including the generated pattern using data of the generated pattern.

8. The non-transitory storage medium according to claim 7, wherein the matrix is defined by arranging the plural pupil functions in individual rows or individual columns.

9. The non-transitory storage medium according to claim 7, wherein light from the point light sources is polarized light, and the pupil functions include three functions corresponding to axes of three-dimensional coordinates.

10. A non-transitory storage medium storing a program that causes a computer to execute the calculation method for calculating an optical image of a pattern projected onto an image plane through a projection optical system by illuminating a pattern on an object plane with an illumination optical system, the method comprising:

setting a pattern on the object plane of the projection optical system;

shifting a pupil function representing a pupil of the projection optical system in accordance with a position of a point light source at coordinates on a pupil plane of the projection optical system for individual point light sources on the pupil plane, and generating shifted plural pupil functions;

defining a matrix containing the generated plural pupil functions;

generating a vector obtained by transposing and complex-conjugating a vector containing, as components, values at an origin coordinate on the pupil plane from among components of the matrix; and calculating an optical image of the pattern by performing convolution integral between the pattern on the object plane and a Fourier transform of a product of the generated vector and the matrix.

11. The non-transitory storage medium according to claim 10, wherein the optical image of the pattern is calculated by squaring an absolute value obtained by performing the convolution integral between the pattern on the object plane and the Fourier transform of the product of the vector and the matrix.

12. An apparatus comprising:

a processor configured to generate a pattern of a mask to be used for a mask manufacturing method for manufacturing the mask using the generated pattern of the mask, wherein the processor is configured to set a pattern on an object plane of projection optical system, shift a pupil function representing a pupil of the projection optical system in accordance with a position of a point light source at coordinates on a pupil plane of the projection optical system for individual point light sources on the pupil plane, and generate shifted plural pupil functions, define a matrix containing the generated plural pupil functions, generate a vector obtained by transposing and complex-conjugating a vector containing, as components, values at an origin coordinate on the pupil plane from among components of the matrix, calculate an image of the pattern on the object plane by performing convolution integral between the pattern on the object plane and a Fourier transform of a product of the generated vector and the matrix, and generate, using the calculated image, an assist pattern for the pattern on the object plane, and generate a pattern including the pattern on the object plane and the assist pattern, wherein the mask manufacturing method comprises a step of manufacturing the mask including the generated pattern using data of the generated pattern.

13. The apparatus according to claim 12, wherein the matrix is defined by arranging the plural pupil functions in individual rows or individual columns.

14. The apparatus according to claim 12, wherein light from the point light sources is polarized light, and the pupil functions include three functions corresponding to axes of three-dimensional coordinates.

15. An apparatus comprising:

a processor configured to calculate an optical image of a pattern projected onto an image plane through a projection optical system by illuminating a pattern on an object plane with an illumination optical system, wherein the processor is configured to set a pattern on the object plane of the projection optical system, shift a pupil function representing a pupil of the projection optical system in accordance with a position of a point light source at coordinates on a pupil plane of the projection optical system for individual point light sources on the pupil plane, and generate shifted plural pupil functions, define a matrix containing the generated plural pupil functions, generate a vector obtained by transposing and complex-conjugating a vector containing, as components, values at an origin coordinate on the pupil plane from among components of the matrix, and calculate an optical image of the pattern, by performing convolution integral between the pattern on the object plane and a Fourier transform of a product of the generated vector and the matrix.

16. The apparatus according to claim 15, wherein the optical image of the pattern is calculated by squaring an absolute value obtained by performing the convolution integral between the pattern on the object plane and the Fourier transform of the product of the vector and the matrix.

\* \* \* \* \*